(12) United States Patent
Daubenspeck et al.

(10) Patent No.: US 8,299,568 B2
(45) Date of Patent: Oct. 30, 2012

(54) DAMAGE PROPAGATION BARRIER

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/028,332

(22) Filed: Feb. 16, 2011

(65) Prior Publication Data

US 2011/0133307 A1    Jun. 9, 2011

Related U.S. Application Data

(62) Division of application No. 11/553,176, filed on Oct. 26, 2006, now Pat. No. 7,910,408.

(51) Int. Cl.
    *H01L 23/58*    (2006.01)
(52) U.S. Cl. .................. 257/529; 257/209; 257/E21.592
(58) Field of Classification Search .................. 257/529, 257/530, 209, 665, E21.592; 438/132
    See application file for complete search history.

(56) References Cited

U.S. PATENT DOCUMENTS

| | | | |
|---|---|---|---|
| 5,420,455 A | 5/1995 | Gilmour et al. | |
| 5,523,253 A | 6/1996 | Gilmour et al. | |
| 6,022,791 A | 2/2000 | Cook et al. | |
| 6,074,940 A | 6/2000 | Lee et al. | |
| 6,104,079 A | 8/2000 | Stamper | |
| 6,448,113 B2 | 9/2002 | Lee et al. | |
| 6,486,526 B1 | 11/2002 | Narayan et al. | |
| 6,525,398 B1 | 2/2003 | Kim et al. | |
| 6,653,710 B2 | 11/2003 | Adkisson et al. | |
| 6,878,614 B2 | 4/2005 | Sun et al. | |
| 7,479,447 B2 * | 1/2009 | Daubenspeck et al. | 438/601 |
| 2003/0139028 A1 | 7/2003 | Sun et al. | |
| 2005/0082635 A1 | 4/2005 | Kang et al. | |
| 2006/0223242 A1 | 10/2006 | Daubenspeck et al. | |

OTHER PUBLICATIONS

International Search Report and Written Opinion, Application Serial #: PCT/EP2007/060219, Date Mailed: Feb. 1, 2008, Title: "Damage Propagation Barrier and Method of Forming", Filing Date: Sep. 26, 2007.

Notice of Allowance, Dated: Sep. 15, 2008 for U.S. Appl. No. 11/277,398, Titled: "Crack Stop Void Formed in a Low-k Dielectric Layer Between Adjacent Fuses", filed Mar. 24, 2006, now U.S. Patent No. 7,479,447.

* cited by examiner

*Primary Examiner* — Jack Chen

(74) *Attorney, Agent, or Firm* — Anthony J. Canale

(57) ABSTRACT

A conductor-filled damage propagation barrier is formed extending into a low-k dielectric layer between a fuse and an adjacent circuit element for preventing propagation of damage during a fuse blow operation. Conductor material filling the damage propagation barrier is formed from the same conductor layer as that used to form an interconnect structure.

11 Claims, 5 Drawing Sheets

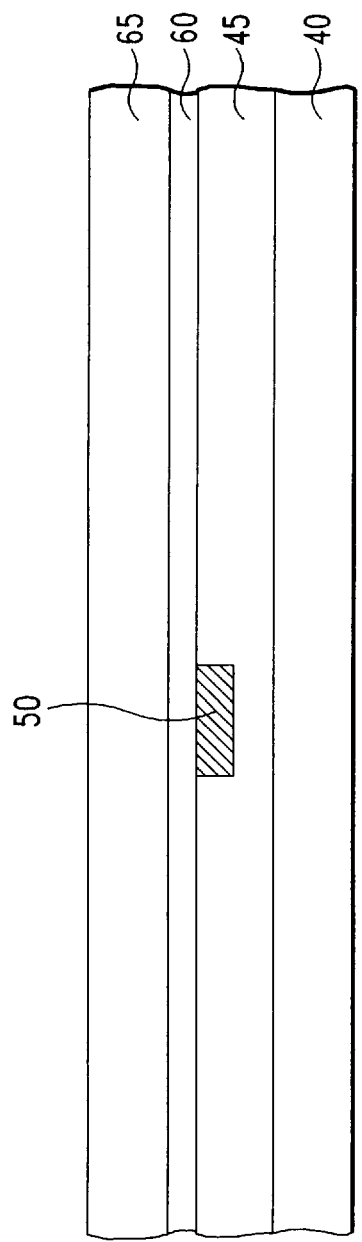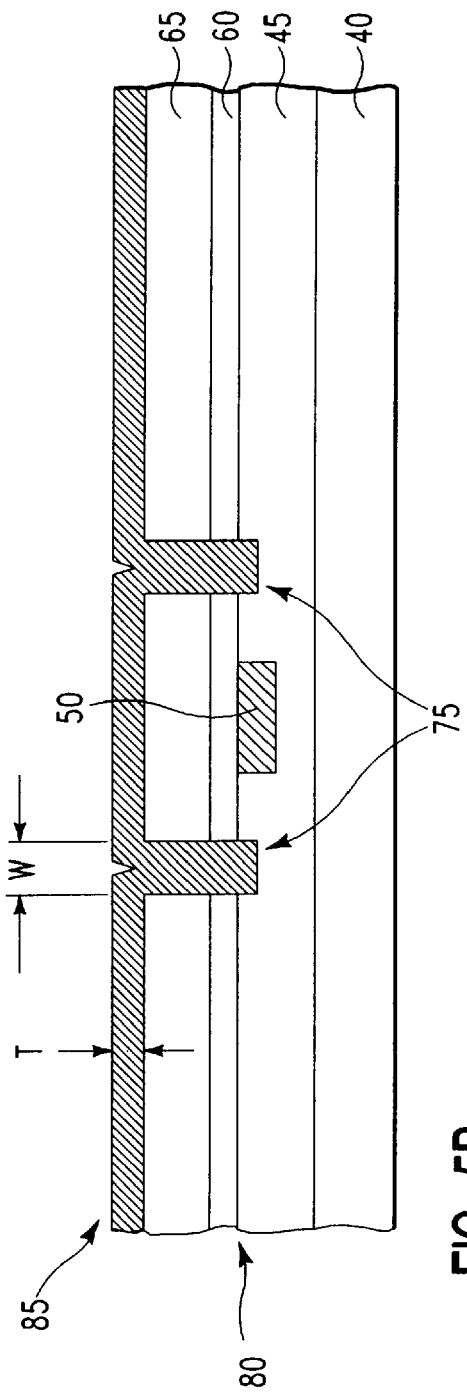

DAMAGE PROPAGATION BARRIER

RELATED PATENT APPLICATION

This application is a divisional of U.S. patent application Ser. No. 11/553,176, filed on Oct. 26, 2006, now U.S. Pat. No. 7,910,408.

This application is related to commonly assigned U.S. patent application Ser. No. 11/277,398, "Crack Stop Void Formed in a Low-k Dielectric Layer Between Adjacent Fuses", filed Mar. 24, 2006, now U.S. Pat. No. 7,479,447, and incorporated in its entirety herein by reference.

FIELD OF THE INVENTION

This invention relates generally to integrated circuits and, more particularly, to protection of circuit elements such as, for example, fuses formed in a low-k dielectric layer from damage when employing a laser beam in a fuse blow operation.

BACKGROUND OF THE INVENTION

Semiconductor integrated circuits (IC) and their manufacturing techniques are well known in the art. In typical integrated circuits, a large number of semiconductor devices are fabricated on a silicon substrate. To achieve the desired functionality, a plurality of conductors or interconnects are typically employed for coupling selected devices together. In some integrated circuits, some of the conductive links may be coupled to fuses which may be selectively programmed (i.e. blown) after fabrication using lasers. By way of example, in a logic integrated circuit, fuses may be employed during manufacturing to protect from destruction some of the gate stacks of the transistors from inadvertent built-up of electrostatic charge. Once the fabrication of the IC is substantially complete, the fuses may be blown or cut to permit the logic circuit to function as if the protective current paths never existed. More commonly, fuses may be employed for repairing defects found in the logic circuit by appropriate replacement of defective elements with redundancy replacement elements present within or without the chip.

Fuses may be selectively blown or programmed with a laser beam. Once blown, the fuse changes from a highly conductive state to a highly resistive state (i.e. non-conductive) which inhibits current from flowing through it and represents an open circuit to the path taken by the current. Typically, a fuse is formed of a metallic material and the laser beam imparts enough energy into the fuse to melt the metal. The fuse is formed in a dielectric material such as silicon oxide and a silicon oxide dielectric layer formed over the fuse. Energy delivered from the laser is absorbed by the surrounding silicon oxide dielectric layers. Since silicon oxide is a relatively "rigid" material, the fuse can be blown with minimal damage to the surrounding dielectric layers. Thus, the risk of incorrectly programming one fuse when programming another nearby fuse is relatively low. FIG. 1 shows fuses 10A-C formed in a silicon oxide dielectric layer 15. Fuse 10A has been "blown" open by a laser (not shown). It is noted that there is minimal damage 16 of the silicon oxide dielectric layer 15 such that adjacent fuses 10A and 10C are not adversely affected by the blowing of fuse 10B.

A trend in the fabrication of integrated circuits is the use of "low-k" dielectric material in an inter-level dielectric layer to reduce parasitic capacitance between interconnects (e.g. wires and vias) resulting in an increase in the speed of devices. Fuses are typically formed in the same inter-level dielectric layer as the interconnects. The use of low-k dielectrics in the back-end-of-line (BEOL) levels can result in a reduction in the material strength of the inter-level dielectric layer. For example, having layers of silicon oxide dielectric (e.g. a rigid material) and low-k dielectric (e.g. a non-rigid material) formed upon each other have resulted in separation of the different material layers when placed under a physical stress. The separation of the inter-level dielectric layers can result in yield or reliability issues due to, for example, exposure of interconnects to air (e.g. corrosion of metal interconnects). Since fuses are formed in the same inter-level dielectric layer as interconnects, fuses are also susceptible to damage.

Thus, fuses formed in a low-k dielectric layer having spacing consistent with conventional silicon oxide fuse integration and high reliability/yield are desired.

SUMMARY OF THE INVENTION

It is an aspect of the present invention to provide a method of forming fuses in a low-k dielectric layer having spacing consistent with conventional silicon oxide fuse integration.

It is another aspect of the present invention to provide a method of forming fuses in a low-k dielectric layer having high reliability and high yield.

The above and other aspects and advantages, which will be apparent to one of skill in the art, are achieved in the present invention which is directed to, in an aspect, a method of forming a damage propagation barrier, the method comprising the steps of:

(a) providing a substrate including a fuse formed thereupon;

(b) forming a region substantially filled with a portion of a conductor layer adjacent to the fuse; and (c) simultaneous with step (b), forming an interconnect structure from another portion of the conductor layer.

In another aspect, the present invention is directed to a semiconductor structure comprising:

a substrate including a first dielectric layer and a fuse formed in the first dielectric layer;

at least a second dielectric layer formed upon the first dielectric layer;

an interconnect structure formed on the at least second dielectric layer, the interconnect structure comprising a portion of a conductor layer having a thickness T; and at least one trench having a width W less than about twice said thickness T, the at least one trench formed in the at least second dielectric layer in the vicinity of the fuse and substantially filled with another portion of the conductor layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 5A-D illustrate exemplary steps for producing the damage propagation barrier of the present invention.

DESCRIPTION OF EMBODIMENTS OF THE INVENTION

When laser fuse integration is considered in material other than a rigid dielectric (e.g. silicon oxide), a concern is a reduction in adhesion of materials. The reduction in material adhesion can lead to excessive delamination, cracking or cratering (hereinafter referred to as "damage") of the materials which can cause reliability and/or yield degradation by incorrectly programming a nearby fuse. One solution is to space the fuses further apart from each other but this will increase the layout footprint (i.e. area) of the fuse bank for a given design. Another solution is to form a void between adjacent fuses as described in, for example, commonly assigned U.S. patent application Ser. No. 11/277,398, however, when a final passivation layer (e.g. dielectric) is required over a last wiring level then portions of the passivation layer form in the void and diminish the effectiveness of the void as a damage barrier since passivation material in the void provides a pathway for damage to propagate through the passivation-filled damage barrier. A solution to allow for the removal of passivation material from the void would be to increase the size of the void but this will consume much of the area between adjacent fuses thus limiting future fuse pitch reduction.

Figure 1:
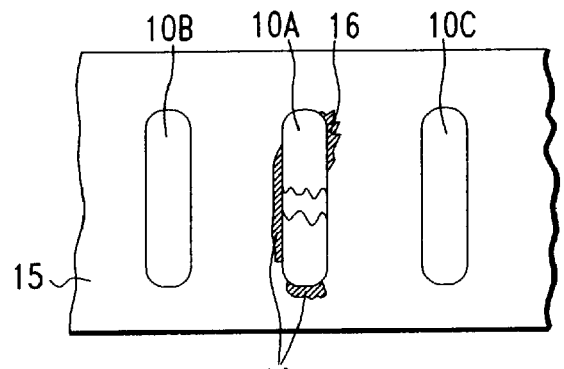
FIG. 1 is a top view of a conventional fuse structure.
Figure 2A:
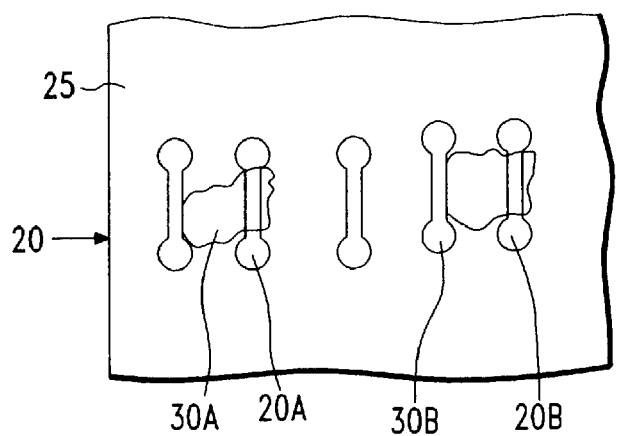
FIGS. 2A-B are top and cross-sectional views, respectively, illustrating damage imparted to a fuse structure after a fuse blow operation.
Figure 2B:
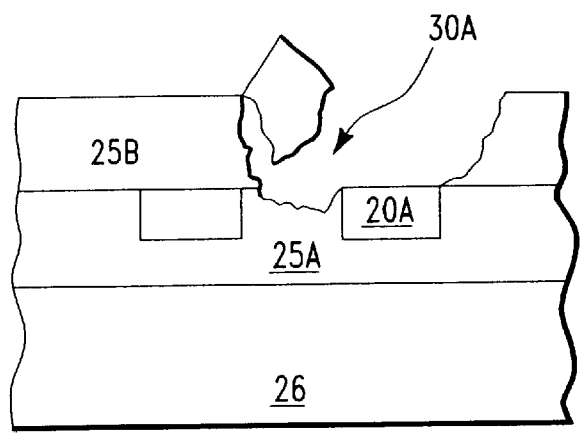
Figure 3:
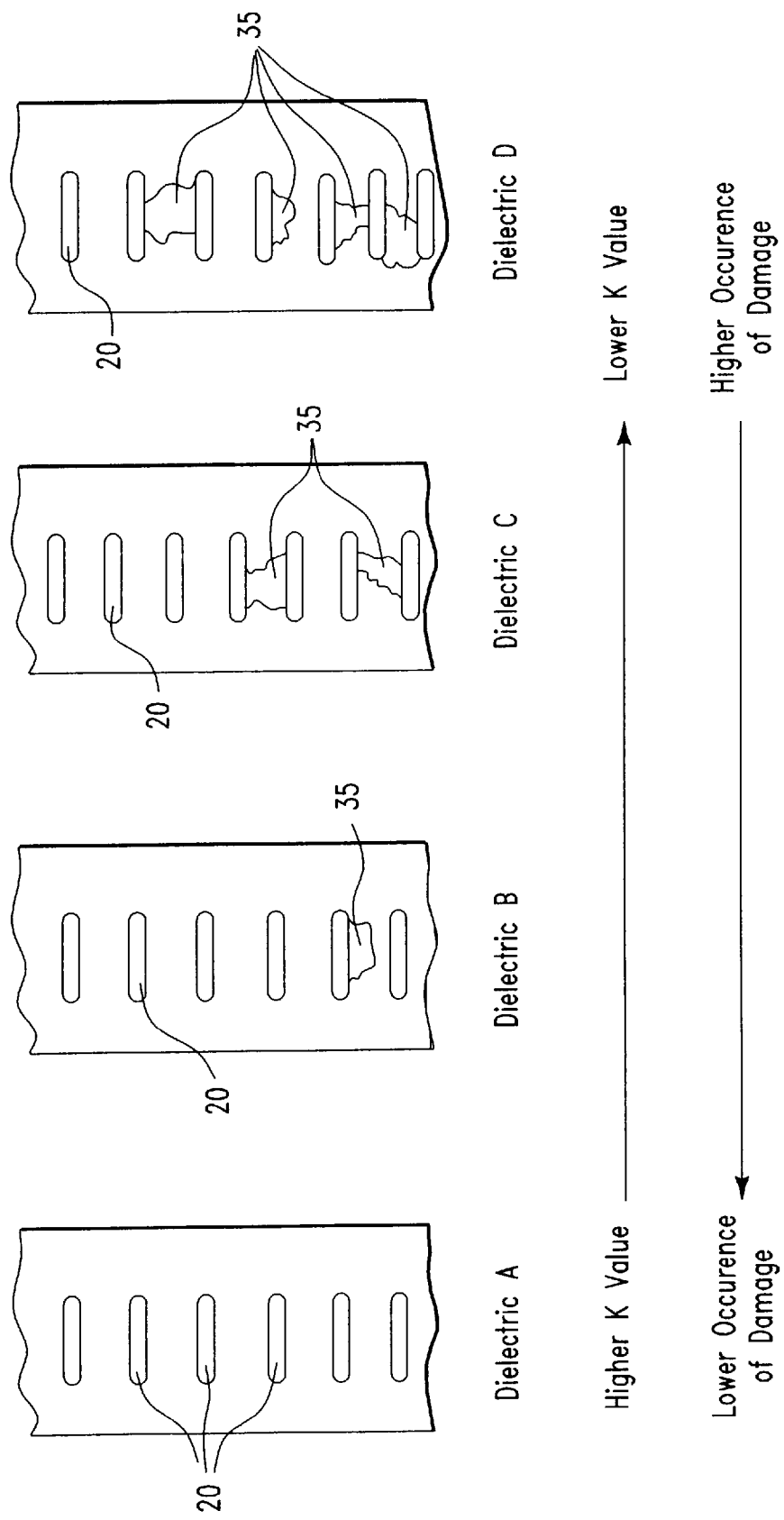
FIG. 3 illustrates a relationship between the dielectric constant of various dielectric layers and the occurrence of damage to the dielectric layer due to a fuse blow operation.

Referring to FIGS. 2A and 2B, fuse bank 20 includes fuses 20A and 20B formed in a dielectric layer 25 on substrate 26. Fuses 20A and 20B can be formed from a metal such as, for example, copper or aluminum. Dielectric layer 25 can include multiple dielectric layers such as, for example, a low-k (dielectric constant) layer 25A and another dielectric layer 25B (e.g. silicon nitride and/or silicon oxide) having a higher k dielectric constant value compared to low-k dielectric layer 25A. A low-k dielectric material has a relative permittivity of 4 or less, examples of which include but are not limited to hydrogen silsesquioxane polymer (HSQ), methyl silsesquioxane polymer (MSQ), SiLK™ (polyphenylene oligomer) manufactured by Dow Chemical, Midland, Mich., Black Diamond™ ($SiO_x(CH3)_y$) manufactured by Applied Materials, Santa Clara, Calif., fluorinated TEOS (FTEOS) and fluorinated silicon glass (FSG). It has been observed that during a fuse blow operation where fuses 20A and 20B are opened by a laser (not shown), damage 30A and 30B of dielectric layer 25 occurs due to delamination of the silicon nitride/silicon oxide dielectric layer 25B from the low-k dielectric layer 25A (see FIG. 2B). As shown in FIG. 2A, damage 30A, 30B can extend to an adjacent un-blown fuse causing reliability and/or yield degradation of the adjacent un-blown fuse due to exposure to the external environment (e.g. air, moisture, temperature cycling). The adjacent un-blown fuse can oxidize when exposed to the external environment resulting in an increase in electrical resistance. FIG. 3 shows a trend that for dielectric materials having a lower dielectric constant (i.e. "k value"), the occurrence of damage 35 caused by a fuse blow operation increases.

Figure 4:
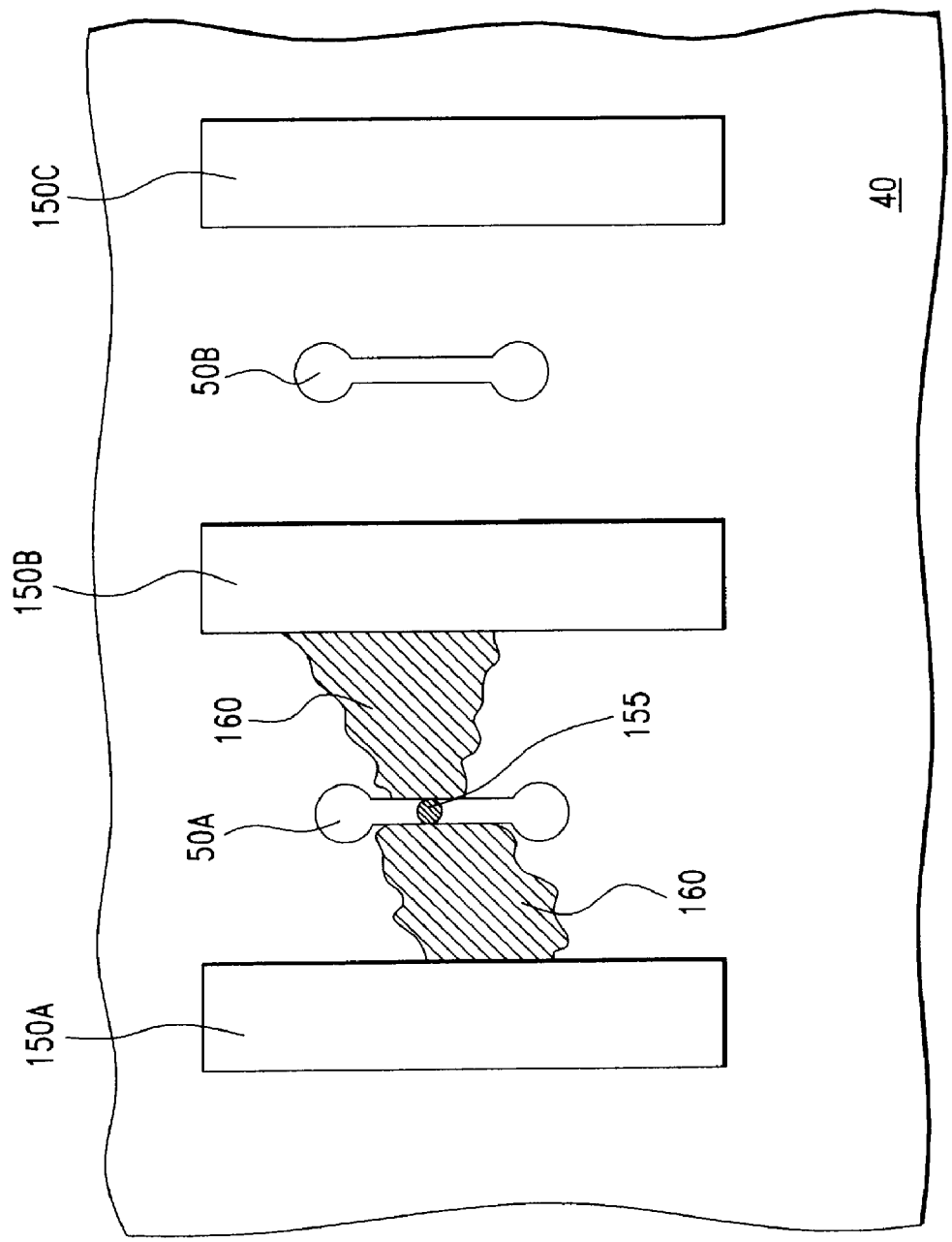
FIG. 4 is a top view of a fuse structure according to the present invention.

According to an embodiment of the invention shown in FIG. 4, circuit elements such as, for example, fuses 50A and 50B (e.g. metal fuses) are formed on substrate 40 in a low-k dielectric layer. Damage propagation barriers 150A-C (herein after referred to as "damage barriers" for sake of clarity) are formed adjacent to fuses 50A and 50B in the immediate vicinity of the region 155 where the fuse is to be blown by a laser (not shown). Damage barriers 150A and 150B prevent damage 160 in the dielectric layers caused by a fusing operation on fuse 50A from propagating to an adjacent fuse (e.g. fuse 50B). As such, damage barriers 150A-C could also be referred to as "crack arresting structures" or "crack stops". Each of damage barriers 150A-C comprises a trench substantially filled with a conductor material such as, for example, a metal (e.g. aluminum) which is also used to form an interconnect structure (e.g. a wire, a conductive transfer pad such as a wire bond pad or a C4 landing pad, or the like). The conductor material in damage barriers 150A-C is formed during the same process steps used to form the interconnect structure. Thus, the conductor material in damage barriers 150A-C is formed without requiring additional masks or process steps which reduces process complexity and costs.

Figure 5C:
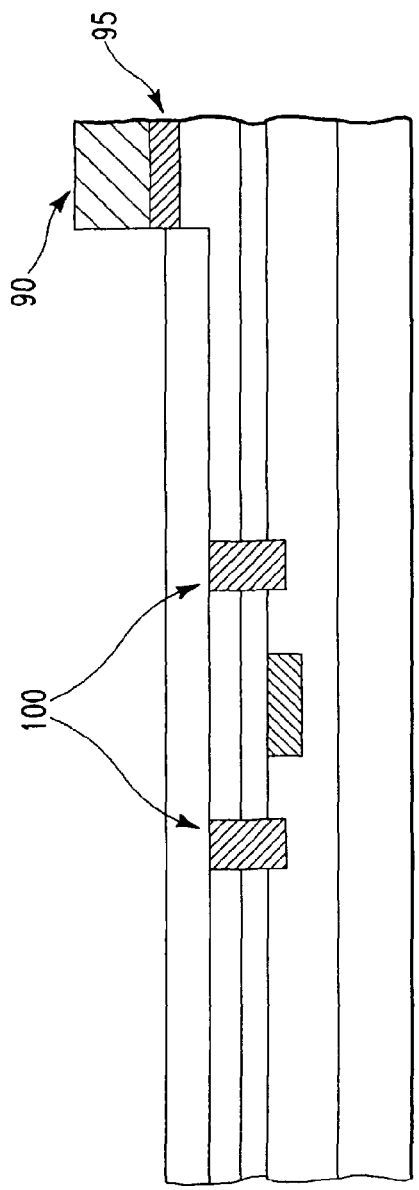

Referring now to FIGS. 5A-D, a method of forming a crack stop void according to an embodiment of the invention will be described. FIG. 5A shows substrate 40 (e.g. silicon, silicon-on-insulator, silicon germanium or gallium arsenide) including a low-k dielectric layer 45 (e.g. FTEOS or FSG) formed thereupon. Low-k dielectric layer 45 can be formed in an interconnect level in a BEOL process. Fuse 50 can be formed in low-k dielectric layer 45 by conventional processes such as, for example, a damascene process including photolithography, deposition of metal (e.g. copper) and chemical mechanical polish. Fuse 50 can be formed of a metal such as, for example, aluminum, copper or tungsten.

Dielectric layers 60, 65 having a higher k value than low-k dielectric layer 45 are formed on low-k dielectric layer 45 and over fuse 50 as shown in FIG. 5A by a conventional deposition process such as chemical vapor deposition (CVD). In an exemplary process, dielectric layer 60 comprises silicon nitride having a thickness from about 50 nanometers (nm) to about 150 nm; and, dielectric layer 65 comprises silicon oxide having a thickness from about 250 nm to about 650 nm. In a copper BEOL technology, dielectric layer 60 serves as a capping layer for copper fuse 50 and copper interconnects while dielectric layer 65 (and dielectric layer 70 described herein below) serves as a passivation layer. Optionally, more than two or less than two dielectric layers could be formed on low-k dielectric layer 45 according to specific requirements.

Referring to FIG. 5B, trenches 75 are formed by conventional photolithographic and etch processes in dielectric layers 60, 65. In an embodiment of the invention, trenches 75 are arranged adjacent to fuse 50 such as, for example, each of trenches 75 is spaced away from and on opposing sides of fuse 50 (see FIG. 5B). Trenches 75 extend into dielectric layer 45 beyond interface 80 of dielectric layer 60 and dielectric layer 45. A conductor layer 85 (e.g. aluminum, copper or gold) having a thickness T is then formed by a conventional deposition process such as, for example, physical vapor deposition, evaporation or sputtering. Trenches 75 are formed having a width W that is preferably less than about twice thickness T of conductor layer 85, more preferably width W is about equal to thickness T or less than about thickness T. For example, for an aluminum conductor layer 85 having a thickness of about 1.3 micrometers (um), width W is from about 1.0 um to about 2.0 um. Forming trenches 75 having widths W less than about twice thickness T of conductor layer 85 ensures that trenches 75 are substantially filled with portions of the conductor layer 85.

A masking layer 90 (e.g. photoresist) is formed by a conventional photolithographic process on conductor layer 85 as shown in FIG. 5C. A conventional etch process (e.g. reactive ion etch) removes exposed portions of conductor layer 85 to substantially simultaneously form an interconnect structure 95 and conductor-filled damage propagation barrier 100.

Interconnect structure 95 can include, for example, a wire, a via, a conductive transfer pad such as a wire bond pad or a C4 landing pad, a test probing pad connect structure, or at least a portion of a passive device such as a metal-insulator-metal capacitor. As exposed portions of conductor layer 85 are removed, an upper surface of damage barrier 100 is formed substantially planar with surrounding dielectric layer 65 which serves as an etch-stop during the removal of the exposed portion of conductor layer 85. Depending on an amount of over-etch during removal of conductor layer 85, the thickness of dielectric layer 65 (which acts as an "etch-stop") may be reduced.

Figure 5D:
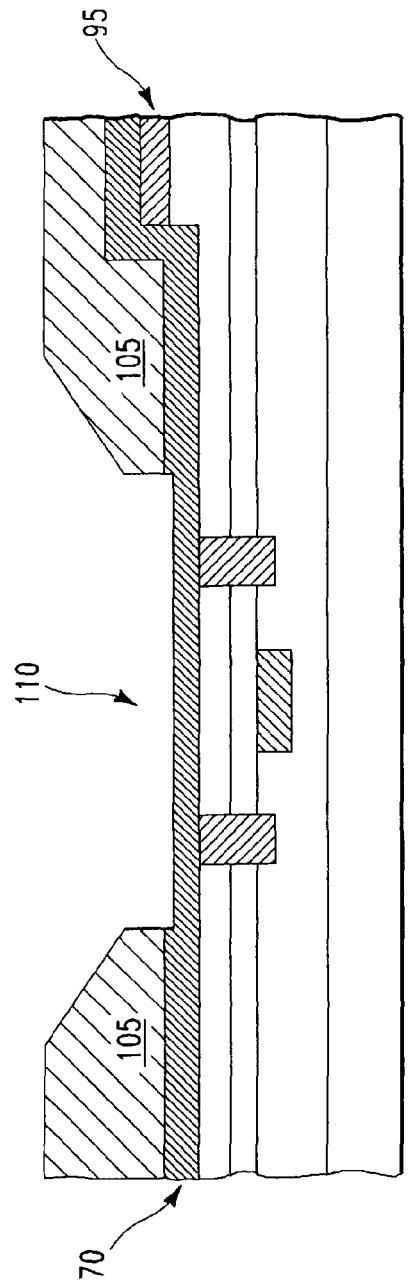

Conventional process steps can be performed to form subsequent dielectric layers overlaying fuse 50 and conductor-filled damage barriers 100. For example, according to an embodiment of the invention as shown in FIG. 5D, a dielectric layer 70 is formed by a conventional deposition process and has at least one function of capping conductor-filled barriers 100. Dielectric layer 70 comprises silicon nitride having a thickness from about 200 nm to about 600 nm. Dielectric layer 105 (e.g. polyimide, benzocyclobutene (BCB), or other types of polymers) is formed on dielectric layer 70 and is patterned using conventional photolithographic and etch processes to form an opening 110 over fuse 50 and extending through dielectric layer 105. It is noted that a thickness of the over fuse dielectric layers (e.g. portions of dielectric layers 60, 65, 70 over fuse 50) is well controlled since only the portion of dielectric layer 70 that is exposed during the etching to form opening 110 is subject to etching resulting in possible thickness variations.

Since the formation of conductor-filled damage barriers 100 are accomplished simultaneously with the formation of interconnect structure 95, additional processing steps dedicated only to the formation of conductor-filled damage barriers 100 are not required. Thus, reductions in fabrication costs and time are achieved. The present invention also provides that the widths of conductor-filled damage barriers 100 can be formed to be, for example, a minimum photolithographic defined dimension thus allowing for future reductions in the fuse pitch. Yet another advantage of the present invention is that it can be used with a variety of different finishing options since damage barriers 100 are filled with a material (e.g. conductor) so the invention can be used when a final passivation level (e.g. polyimide layer 105) is or is not required. When a final passivation level is required, the conductor formed in damage barriers 100 prevents dielectric from forming in the damage barriers 100.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

We claim:

1. A semiconductor structure comprising:
   a substrate including a first dielectric layer and a fuse formed in said first dielectric layer;
   at least a second dielectric layer formed upon said first dielectric layer;
   an interconnect structure formed on said at least second dielectric layer, said interconnect structure comprising a portion of a conductor layer having a thickness T; and
   at least one trench having a width W less than about twice said thickness T, said at least one trench formed in said at least second dielectric layer in the vicinity of said fuse and substantially filled with another portion of said conductor layer having said thickness T that is noncontiguous with said portion of said conductor layer having said thickness T associated with said interconnect structure.

2. The semiconductor structure of claim 1, wherein said first dielectric layer comprises a non-rigid material and said at least second dielectric layer comprises a rigid material.

3. The semiconductor structure of claim 1, wherein said first dielectric layer comprises a low-k dielectric selected from one of hydrogen silsesquioxane polymer (HSQ), methyl silsesquioxane polymer (MSQ), polyphenylene oligomer, $SiO_x(CH3)_y$, fluorinated TEOS (FTEOS) and fluorinated silicon glass (FSG).

4. The semiconductor structure of claim 1, wherein said at least second dielectric layer comprises a layer of silicon oxide formed on a layer of silicon nitride.

5. The semiconductor structure of claim 1, wherein said conductor layer comprises aluminum, copper or gold.

6. The semiconductor structure of claim 1, wherein said interconnect structure comprises an interconnect wire, a conductive transfer pad, a via, a pad connect structure or at least a portion of a passive device.

7. The semiconductor structure of claim 1, wherein said at least one trench extends into at least a portion of said first dielectric layer.

8. The semiconductor structure of claim 1, wherein said at least one trench comprises a first trench adjacent to a side of said fuse and a second trench adjacent to an opposite side of said fuse.

9. The semiconductor structure of claim 1, wherein said at least one trench is located between said fuse and an adjacent circuit element.

10. The semiconductor structure of claim 9, wherein said adjacent circuit element comprises another fuse or said interconnect structure.

11. The semiconductor structure of claim 1, wherein said width W is about less than or equal to said thickness T.

* * * * *